United States Patent [19]

Trotel

[11] 4,418,283
[45] Nov. 29, 1983

[54] MICROLITHOGRAPHIC SYSTEM USING A CHARGED PARTICLE BEAM

[75] Inventor: Jacques Trotel, Paris, France

[73] Assignee: Thomson-CSF, Paris, France

[21] Appl. No.: 207,707

[22] Filed: Nov. 17, 1980

Related U.S. Application Data

[63] Continuation of Ser. No. 59,200, Jul. 20, 1979.

[30] Foreign Application Priority Data

Jul. 24, 1978 [FR] France .................. 78 21826

[51] Int. Cl.³ ............................ H01J 37/147
[52] U.S. Cl. ...................... 250/492.2; 250/398
[58] Field of Search ........ 250/491, 492.1, 492.3, 250/492.2, 398, 397, 396 R, 423 R; 315/31 R; 219/121 EX, 121 EW, 121 EY, 121 EU, 121 EV; 350/361; 313/309, 336

[56] References Cited

U.S. PATENT DOCUMENTS

| | | | |
|---|---|---|---|
| 3,278,679 | 10/1966 | Newberry | 315/31 R |
| 3,900,737 | 8/1975 | Collier et al. | 250/492.2 |
| 3,998,678 | 12/1979 | Fukase et al. | 313/309 |
| 4,063,103 | 12/1977 | Sumi | 250/398 |
| 4,088,896 | 5/1978 | Elkins et al. | 250/492.2 |
| 4,130,761 | 12/1978 | Matsuda | 250/492.2 |
| 4,153,843 | 5/1979 | Pease | 250/396 R |

FOREIGN PATENT DOCUMENTS

53-29080 3/1978 Japan .................. 250/492.2

Primary Examiner—Alfred E. Smith
Assistant Examiner—Carolyn E. Fields
Attorney, Agent, or Firm—Cushman, Darby & Cushman

[57] ABSTRACT

A sample on which pre-established patterns are to be defined is rigidly fixed to a moving object-holder and subjected to bombardment with a beam of charged particles by means of a microlithographic system. This system comprises an array of elements placed in one plane in a predetermined spatial configuration and an imaging system having a magnification which is considerably less than unity, the elements being each capable of assuming two distinct states. A narrow beam of charged particles which emerges from each element is on-off modulated according to the state assumed by the element under the control of logic circuits.

The plane of the sample is adapted to correspond to the plane of the elements with respect to the imaging system and the elements are disposed at the intersections of the lines and columns of a matrix. The logic circuits permit the sequential application of a suitable voltage in accordance with a program which is pre-established in relation to the patterns to be drawn and in synchronism with the displacement of the object-holder.

15 Claims, 18 Drawing Figures

MICROLITHOGRAPHIC SYSTEM USING A CHARGED PARTICLE BEAM

This is a continuation of application Ser. No. 59,200, filed July 20, 1979.

This invention relates to a device for microlithography by bombardment with charged particles.

Many devices of different types have already been employed for microlithography by photon beam, electron beam or ion beam. In particular, one well-known microlithographic technique consists in utilizing the computer-programmed deflection of an electron beam for bombarding a sample in successive zones in order to define a predetermined pattern, said sample being coated with a resin which is sensitive to said electron bombardment.

The disadvantage of this method lies in the fact that it is not very rapid since a relatively long period of time may be required in order to prepare a mask. One solution is to project a succession of rectangular images having variable dimensions. The gain in rapidity depends on the size of the rectangles. In the case of a complex pattern which can be divided only into very small rectangles, the gain in rapidity is therefore relatively slight.

In the field of microlithography, there are some applications in which it is preferable or even essential to employ an ion beam instead of an electron beam. The following applications can be mentioned by way of example but not in any limiting sense:

modification of solubility of certain types of organic resins;

modification of solubility of certain inorganic substances in the form of thin films, in the presence of certain agents. By way of example, the rate of attack of silica by hydrofluoric acid is considerably increased by proton bombardment;

direct sputtering of materials which are present on the sample in the form of a thin film by directing an ion beam onto said sample.

Furthermore, ion-beam microlithography offers the following advantages over photon-beam or electron-beam microlithographies:

low diffraction, since the energy gained by the ions corresponds to an associated wavelength which is negligible. This holds true in the case of electrons;

a low degree of lateral diffusion since inelastic collisions are preponderant in the process of slowing-down of an ion which bombards a solid material. The energy of the ion at the instant of impact is absorbed in an elementary volume located in the immediate portion of the line of extension of the incident ion path.

The invention relates to a microlithographic device which makes it possible to form pattern lines at much higher speed by bombardment of a sample with charged particles. In a first approach, these particles can be electrons; in a second approach, the particles can be ions. Each approach comprises two alternative modes of execution.

The device according to the invention for microlithography by bombardment of a sample with a beam of charged particles, said sample on which pre-established patterns are intended to be drawn being rigidly fixed to a moving object-holder, comprises an array of elements placed in the same plane in a predetermined spatial configuration and capable of assuming two distinct states and an imaging system for producing a magnification which is considerably less than unity. The device is essentially distinguished by the fact that a narrow beam of charged particles emerges from each element and is on-off modulated according to the state assumed by the element under the control of logic circuits. In addition, the plane of the sample to be bombarded is adapted to correspond to the plane of the elements with respect to the imaging system and the elements are disposed at the intersections of the lines and columns of a matrix. The logic circuits permit the sequential application of a suitable voltage in accordance with a program which is pre-established in relation to the patterns to be drawn and in synchronism with the displacement of the object-holder.

Further advantages will become apparent from the following description which will serve to gain a more complete understanding of the invention, reference being made to the accompanying drawings in which.

Figure 1:
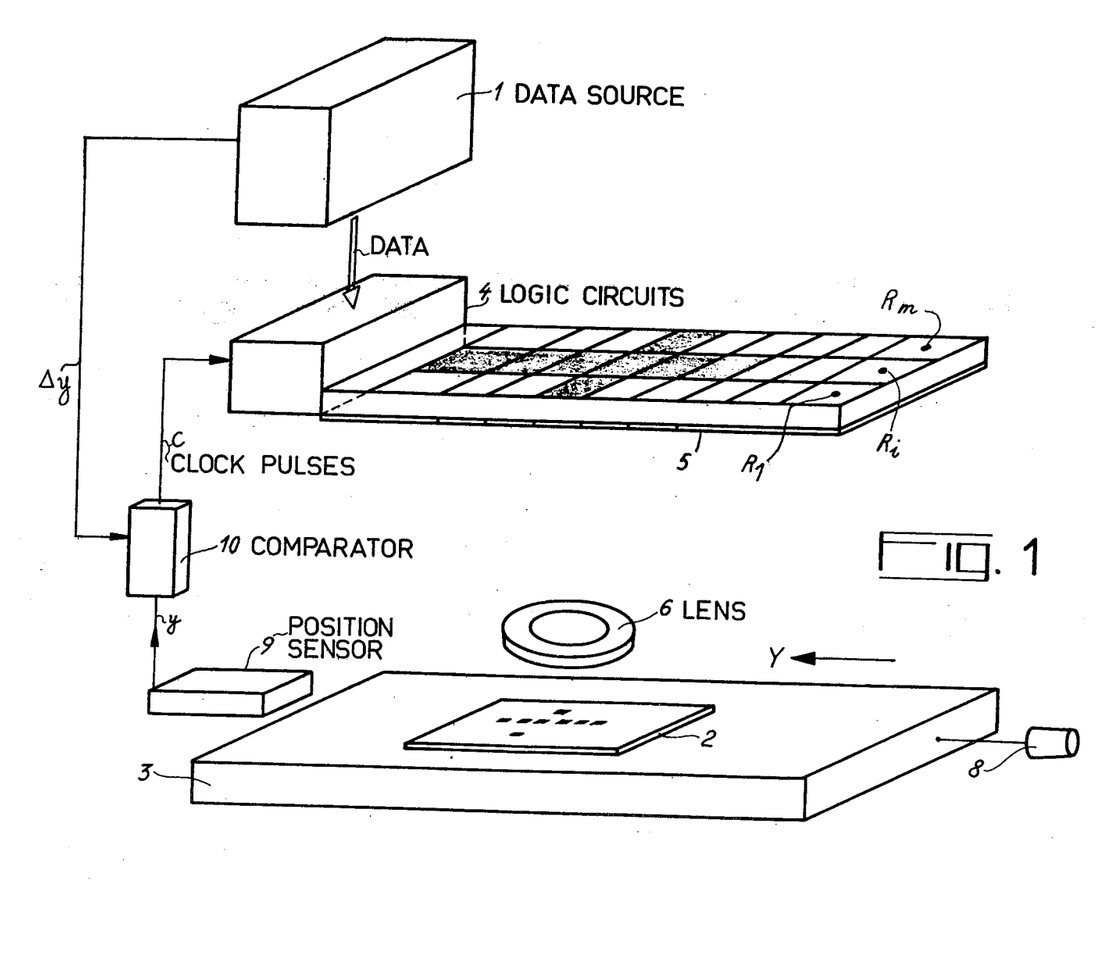
FIG. 1 is a schematic diagram of a first alternative embodiment of the invention in accordance with the first approach which consists of bombardment with an electron beam.

In FIG. 1, a data source is designated by the reference 1 and can be a digital data-processing system such as, for example, a microprocessor associated with storage means in which is programmed a series of predetermined patterns to be etched on a silicon plate 2 or sample carried by an object-holder 3.

Figure 2:
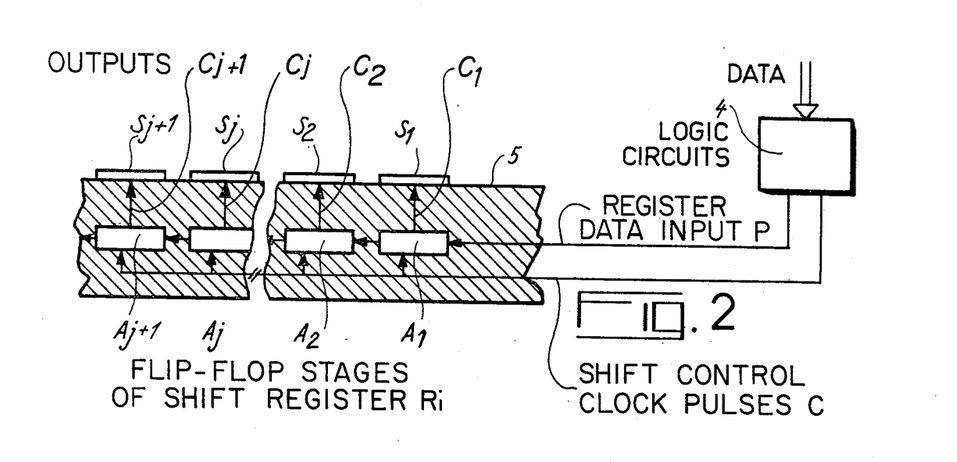
FIG. 2 is an electrical diagram showing the electron source employed in this alternative embodiment.

Said data source is connected to an interface logic circuit 4 essentially comprising the input stages of a certain number of shift registers $R_1$ to $R_m$ which are loaded with binary data P corresponding to the program and one of which is shown in FIG. 2. Each register comprises n stages which are capable of assuming two logical states "0" or "1". The potential 0 V or $-\Delta V$ corresponding to the logical state of each stage $A_j$ is applied to one element of an array 5 of electron sources 5. Each source $S_j$ is of very small size and is made either active when the stage of the corresponding register is in state "1" or passive when the stage is in state "0". By means of an electron-optical unit 6, a real image of said source 5 is formed on the sample 2 with a magnification of the order of $-(1/100)$. A motor 8 serves to displace the object-holder in the direction Y, namely in the direction indicated by the arrow. A position sensor 9 measures the displacements Y of the object-holder table. In accordance with known practice, said sensor can comprise an interferometer associated with a fringe counter. A comparator 10 delivers pulses C each time the instantaneous number indicated by the counter exceeds the previous number by a predetermined value $\Delta y$ corresponding to the displacement of the table by a multiple, also predetermined, of an increment corresponding to the dimension of a point. Each pulse C causes the information to be transferred from one stage to the next or in other words from stage $A_j$ to stage $A_{j+1}$ at the frequency of the clock pulses C.

FIG. 1 shows the process which takes place when writing a pattern such as a shape representating a cross, for example. Said cross is formed by six elements in the line controlled by the register $R_i$ and by one element respectively in the lines controlled by the registers $R_1$ and $R_m$. These three registers have alone been shown in the figure for reasons of enhanced simplicity.

At the initial instant T of pattern drawing, the information P begins to be loaded into the stage $A_1$ of the register $R_i$. The same applies to the registers $R_1$ to $R_m$. If t is the time of transfer from one stage to the next, then at the end of the time interval $T+6t$, the stages $A_1$ to $A_6$ of the resister $R_i$ will be in state 1; at the instant $T+4t$, the stages $A_4$ of the registers $R_1$ and $R_m$ will be in state "1". The pattern of the example previously retained will therefore be completely written at the end of the time interval $T+6t$. This pattern will move over the cathode (array 5 of the electron sources) at the frequency of the clock pulses. Assuming in a first stage that the speed of travel of the object-holder is sufficiently low to result in a virtual step-by-step operation even if the object-holder is displaced in continuous motion at a speed proportional in the ratio of magnification of the optical unit 6 to that of propagation of the invention, and since said unit produces an inverted image of the cathode, the general effect thereby achieved is exactly as if the object-holder were "seeing" a fixed image of the cathode. It is this image which will expose the resin which is sensitive to electron bombardment.

The following considerations make it possible to establish the number m of registers and the number n of stages of each register.

Let t be the writing time for each point, this time being pre-established in the programs;

Let $T_R$ be the image writing time defined by the sensitivity of the resin and the characteristics of the electron-optical system;

Let $T_e$ be the time necessary for writing in each register.

The higher value of m or n will be defined by the resolving power of the optical system; for example, m and n can be of the order of 4000. Moreover, if the optical system has axial symmetry, m can be equal to n.

The writing time of the registers $T_e$ must be shorter than mt in order to ensure that the writing time in the registers is shorter than the image formation time. Finally, $T_R$ must be shorter than mnt.

As can readily be understood, it is not essential to employ shift registers. It is simply essential to ensure that the emissive elements are so arranged that the information reaches them at the end of time spaces which are proportional to their distance from the origin plane.

Figure 3:
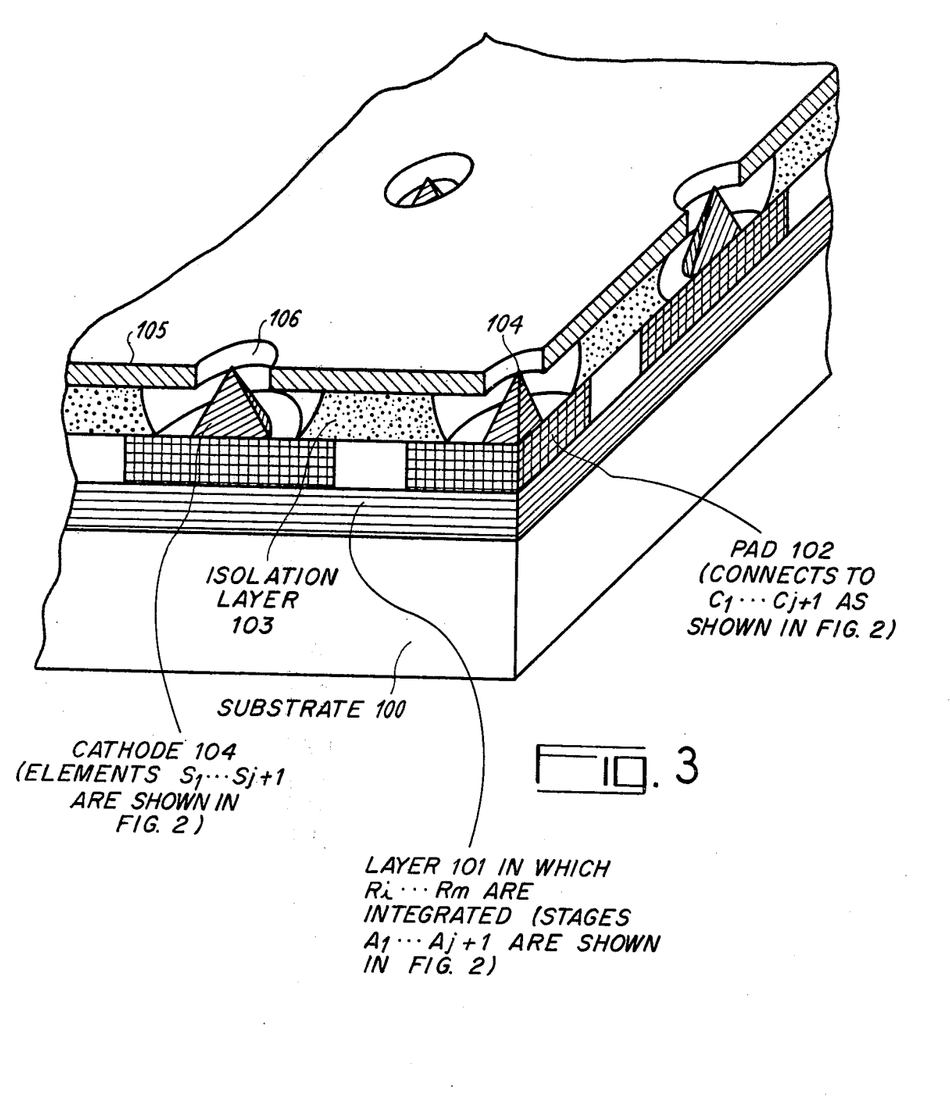
FIG. 3 is a perspective view showing one example of construction of a cathode employed in the device according to the alternative embodiment of FIG. 1.

FIG. 3 illustrates one example of multiple-element cathodes which can be utilized in the device according to the invention. These elements have been described in the article on the Ninth Conference on Tube Techniques, Sept. 17-18, 1968 in IEEE Record of 1968, pages 213–222 or in the article published in the Journal of Applied Physics, Vol. 47, No. 2, December 1976, pages 5248–5263.

There is deposited on a substrate 100 of intrinsic silicon a layer 101 of heavily doped silicon in which are integrated the different shift registers $R_1$ to $R_m$. One pad 102 of heavily doped silicon which serves as a connection corresponds to each stage $A_j$ of each register $R_i$. There is formed on this array a layer 103 of silica over which is placed a layer 105 of molybdenum. Recesses having a diameter of approximately 1.5 $\mu$m forming lines and columns have been formed by photolithographic processes in the layer 105 and the layer 103; the respective recesses designated by the reference 106 contain respectively the pads 102.

Molybdenum cones 104 are deposited on said pads, the apex of each cone being level with the surface of the layer 105. The depth of the molybdenum layer is substantially 0.4 $\mu$m. The operation of the assembly is as follows: a potential of the order of 0 V is applied to the molybdenum layer. The potential 0 V corresponds to the logical state "0".

Setting of each pad into state "1" by the stage $A_j$ of the register $R_i$ which is associated with this latter in the layer 101 is produced by a reduction of its potential to $-20$ V. In structures of this type, this voltage is sufficient for the emission of electrons through the apex of each cone (active state).

These electrons are transferred to the electron-optical system 6 of FIG. 2. The real image of the structure which has just been represented is therefore the electron source 5 of FIG. 2.

The various electrical connections in FIG. 3 are described in greater detail below.

$A_1$ to $A_{J+1}$ are register stages of one of the shift registers three of which are illustrated in FIG. 1 ($R_1$, $R_I$ and $R_M$). Specifically $A_1 \ldots A_{J+1}$ represent the various stages of shift register $R_I$. Each stage of the shift register is preferably formed by a flip-flop or analogous device. One output of each stage of each shift register is coupled to a corresponding element of charged particle source. These elements are are arranged in matrix fashion. Each time the output of a particular stage of a shift register is in the logical state "1" its associated element is activated. The shifting of data from one shift register stage to the next is done under the control of a position sensor such as an interferometer associated with a fringe counter. Such position sensors are known in prior art systems. One suitable fringe counter is shown in U.S. Pat. No. 3,786,332—Hepner and another as described in U.S. Pat. No. 3,934,187—Trotel. The information in these patents is incorporated herein by reference.

Pads $S_1 \ldots S_{J+1}$, shown in FIG. 2, correspond to electrodes 104 shown in FIG. 3. The "P data" line is coupled to the input of shift register $R_I$ (having stages $A_1 \ldots A_{J+1}$). The clock pulse line is coupled to a common shift register line, as shown in FIG. 2. The outputs from each shift register stage provide control voltages for their associated control electrodes $S_1 \ldots S_{J+1}$, which are the cathode of FIG. 3. When flip-flops are used, there are two outputs provided for each stage (Q and Q bar). Only one of these would be used. In FIG. 3, plate 5 (shown in FIG. 2) is formed by layers 110 to 103 and 105. The shift register stages are integrated into layer 101.

Figure 4:
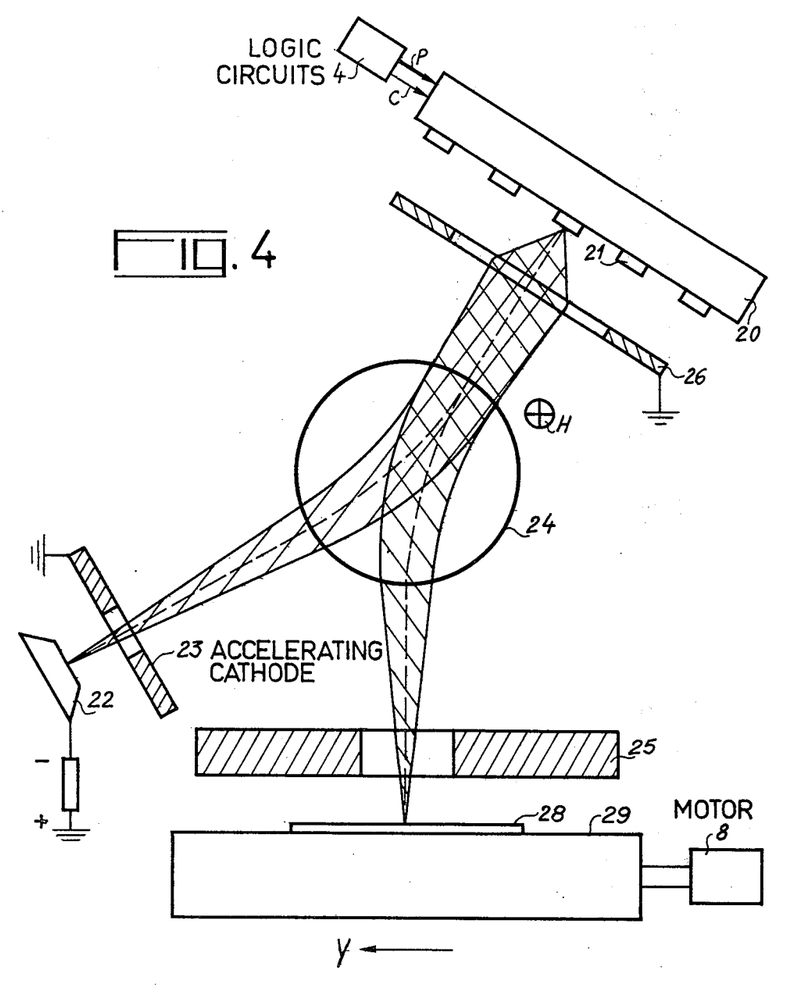
FIG. 4 is a schematic diagram showing a second alternative embodiment of the invention in accordance with the first approach.

FIG. 4 illustrates a second alternative embodiment of the invention in accordance with the first approach. There is again employed an array 20 comprising pads 21 of conductive material, said pads being disposed in a matrix as in the previous instance and each connected to one stage of a shift register (not shown in the figure) and integrated in the substrate 20. When the corresponding stage is in state "0", said pads are at the potential $-V$; when said stage is in state "1", said pads are at the potential $-(V+\Delta V)$, where $\Delta V$ is of the order of 20 V at absolute value as in the previous case.

An electron-optical element 26 which is brought to the potential 0 V is placed in the vicinity of said source 5. An electron source 22 which is brought to the potential $-V$ emits electrons which are formed in a beam by a grounded accelerating anode 23. Said electrons traverse a magnetic prism 24 which produces a field H at right angles to the plane of the figure. The beam is then deflected towards the assembly 21-26.

The electrons which strike the pads at the potential $-V$ are absorbed. Those electrons which are directed towards the pads at the potential $-(V+\Delta V)$ are repelled. The general process involved is much the same as if the pads just mentioned were cathodes of the same type as the cathodes of the first embodiment and "emitted" electrons with an accelerating voltage $\Delta V$ of the order of 20 volts as in the previous case. These electrons pass back through the prism 24. They are directed towards a further electron lens 25. The lens just mentioned forms an imaging system in conjunction with the assembly 20-26. With respect to said system, that face of the assembly 20 which is subjected to electron impact and the plane 28 of the sample to be bombarded are stigmatic. This assembly has a magnification of $-(1/100)$. As in the previous case, a continuous movement is imparted to the object-holder 29 in the direction of the arrow.

The operation is substantially the same as in the previous embodiment except for the fact that the pads are not real cathodes but act as reflectors or as electron absorbers.

This assembly for emitting reflected electrons therefore behaves in the same manner as the cathode assembly of FIG. 1.

Figure 5:
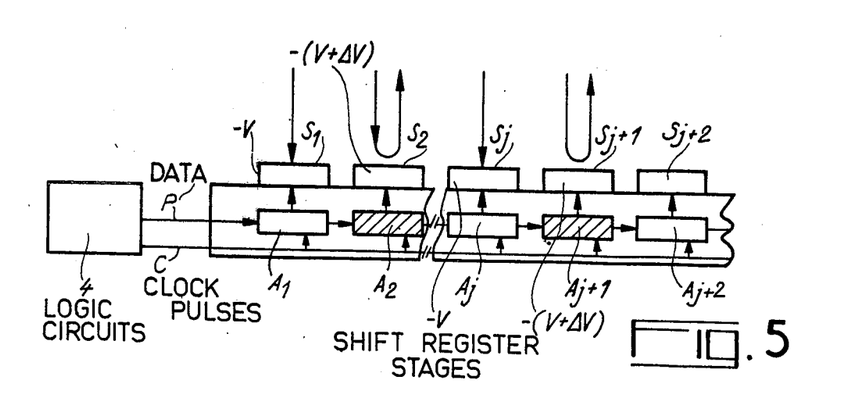
FIG. 5 is a detail sectional view of FIG. 4.

FIG. 5 shows the cathode assembly which will be designated as a secondary assembly.

Each pad $S_j$ is connected to one stage $A_j$ of a shift register which is similar to those of FIG. 2. The pads are placed in lines and in columns as in the previous instance and the assembly is controlled in the same manner.

Figure 6:
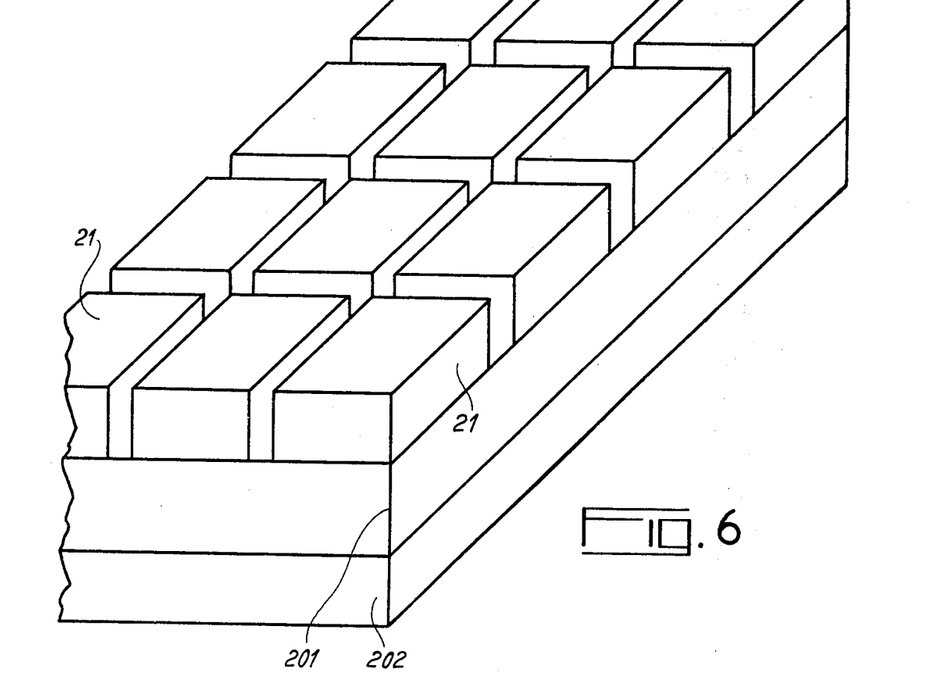
FIG. 6 shows a deflector element employed in the second alternative embodiment.

FIG. 6 shows in perspective one example of construction of a cathode target 20. By way of example, the pads 21 are of molybdenum. The sides of said pads have a width of the order of 5 $\mu$m and the distance between centers is of the order of 10 $\mu$m; the height of each pad is of the same order. Said pads are deposited on a doped silicon layer 201 in which are placed the shift registers (not shown). The complete unit is deposited on a plate 202 of intrinsic silicon.

Figure 7:
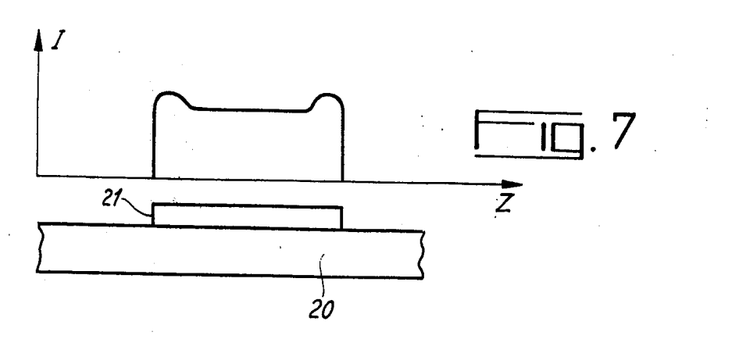
FIGS. 7 and 8 are explanatory diagrams.
Figure 8:
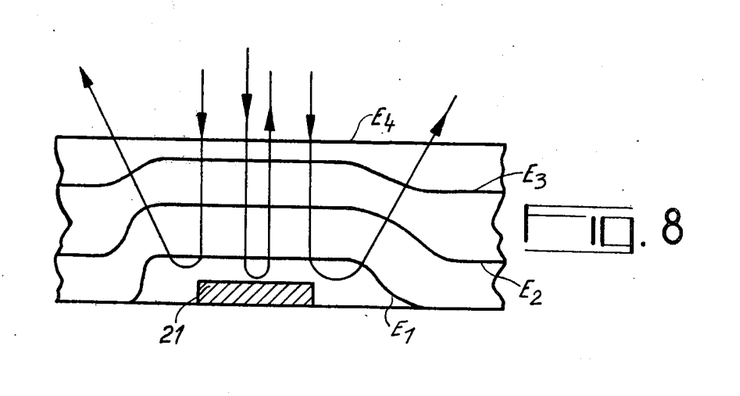

FIG. 7 and FIG. 8 are diagrams which both serve to explain the way in which it is possible to correct the effect known as the proximity effect.

There is shown in FIG. 7 the curve of current density I of electron bombardment which is desirable for accurate exposure of an isolated line, the cross-section of which is shown diagrammatically in FIG. 8. If this line is isolated, it must be ensured as shown by the curve that the intensity is higher at the edges of each pad 21 than in the central portion of this latter. FIG. 8 in fact shows the distribution of equipotential lines E in the vicinity of a reflecting pad. It is observed that the axial portions reflect a narrow electron beam without any change of direction. The same does not apply to the peripheral portions which reflect the electrons in a different direction by reason of the shape of the equipotential lines.

Figure 9:
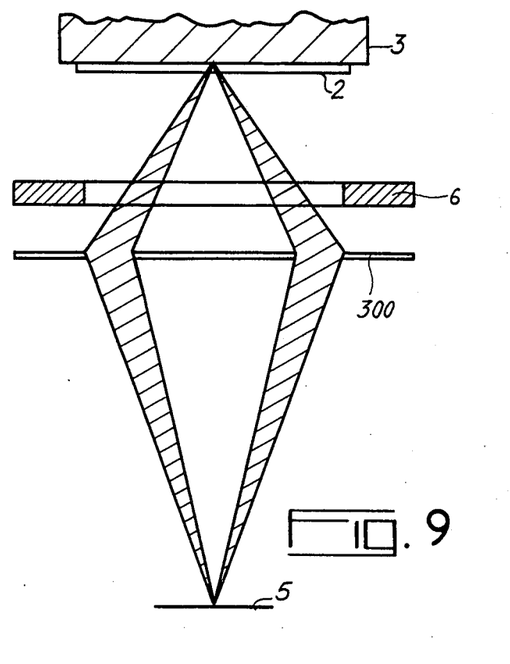
FIGS. 9 and 11 illustrate respectively two systems for improving the image formed.
Figure 10:
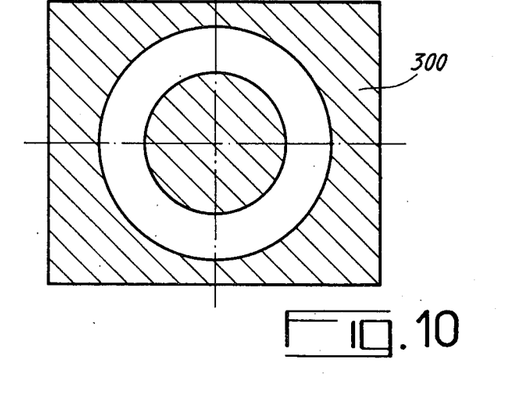
FIGS. 10 and 12 illustrate the two diaphragms employed in the systems of FIGS. 9 and 11.

In the case of the first alternative embodiment of the invention and in order to obtain maximum intensity at the edges of the image which is projected onto the object-holder, it will only be necessary (as shown in FIG. 9) to place a diaphragm 300 between the lens 6 and the object-holder 3. This diaphragm of the annular type as shown in FIG. 10 eliminates axial rays in order to permit the passage only of the rays which are inclined to the axis.

Figure 11:
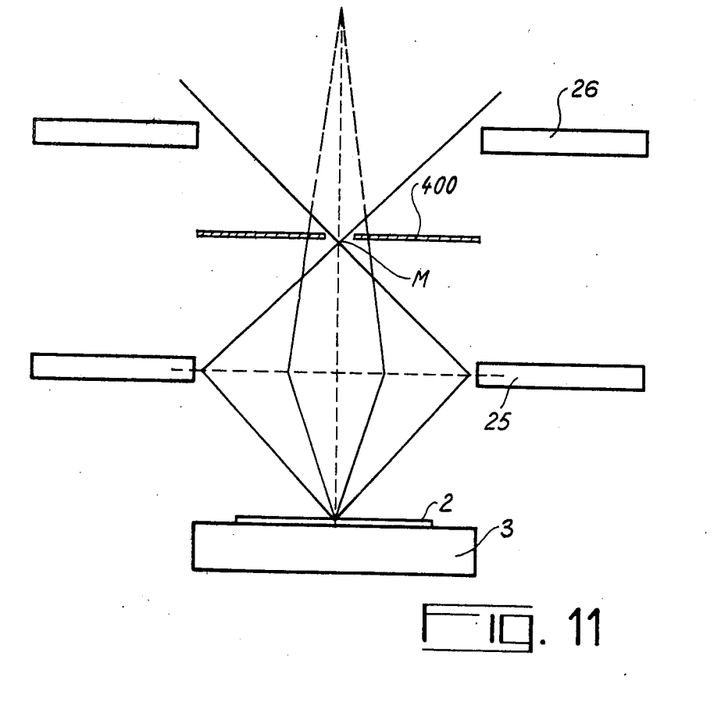
Figure 12:
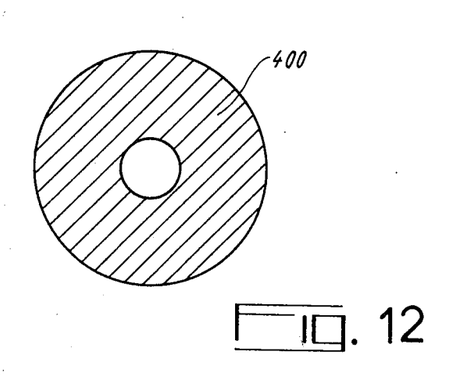

In FIG. 11, the spherical aberrations of the lens provided in the second alternative embodiment of the invention are turned to profitable account with a view to eliminating the axial rays. Thus it is only necessary to place a diaphragm 400 having the shape indicated in FIG. 12 at the point M of intersection of the oblique rays with the axis. The magnetic prism 24 of FIG. 4 has been omitted.

For the sake of convenience of reasoning, it had been assumed earlier in the description that the lens displacement motor operated on the step-by-step principle and stopped at each exposure. In actual fact, however, the motor operates in continuous rotation.

In order to obtain correct writing, it is therefore necessary to ensure that the electron beam follows the motion of the object-holder at the moment of each exposure. To this end, it is only necessary to add thereto a deflecting system of the type disclosed in U.S. patent application Ser. No. 962,758, now abandoned, filed by the present Applicant on Nov. 17th, 1977 and entitled "Device enabling figures of different shapes to be drawn in programmed fashion". The operation of this device is recalled with reference to FIGS. 13 and 14.

Figures 13, 14:
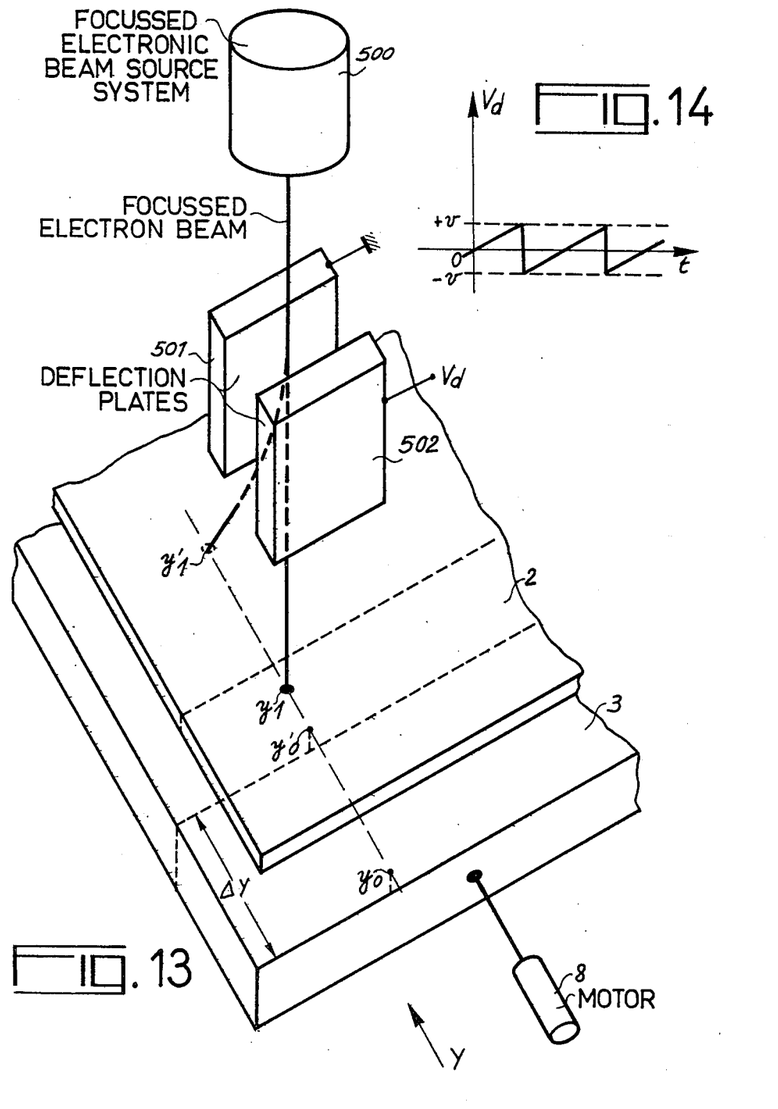
FIGS. 13 and 14 relate to a deflector element which can be associated with the device.

An electrostatic deflection device 501-502 is placed in the vicinity of the sample 2. As in the cited Application, a sawtooth voltage Vd shown in FIG. 14 is applied to said device and deflects the beam in the direction of displacement of the object during the period of each exposure. The dashed lines represent the position of the object-holder 3 and of the sample when the motor 8 has produced a displacement along the axis Y having an amplitude $\Delta y$. The point $y_o$ arrives at $y_o'$. In consequence, the impact of the electron beam must move from $y_1$ to $y_1'$. This is achieved by means of the variation in voltage applied to the terminals of the deflection plates 501 and 502. This voltage Vd varies between $-v$ and $+v$ in synchronism with the movement of the object-holder 3. In this figure, the general reference 500 designates the systems of FIGS. 1 and 4 which constitute sources of focused electron beams.

The second approach of the invention will now be described with reference to FIGS. 15 and 16.

A device for microlithography by ion bombardment can also be constructed in accordance with two alternative forms which retain substantially the same structures as those proposed in FIGS. 1 and 4 relating to devices which make use of an electron beam. The essential differences lie on the one hand in the nature of the charged particle source and on the other hand in the polarities of the voltages supplied to the different electrodes of the device, the ions being positively charged particles.

Figure 17:
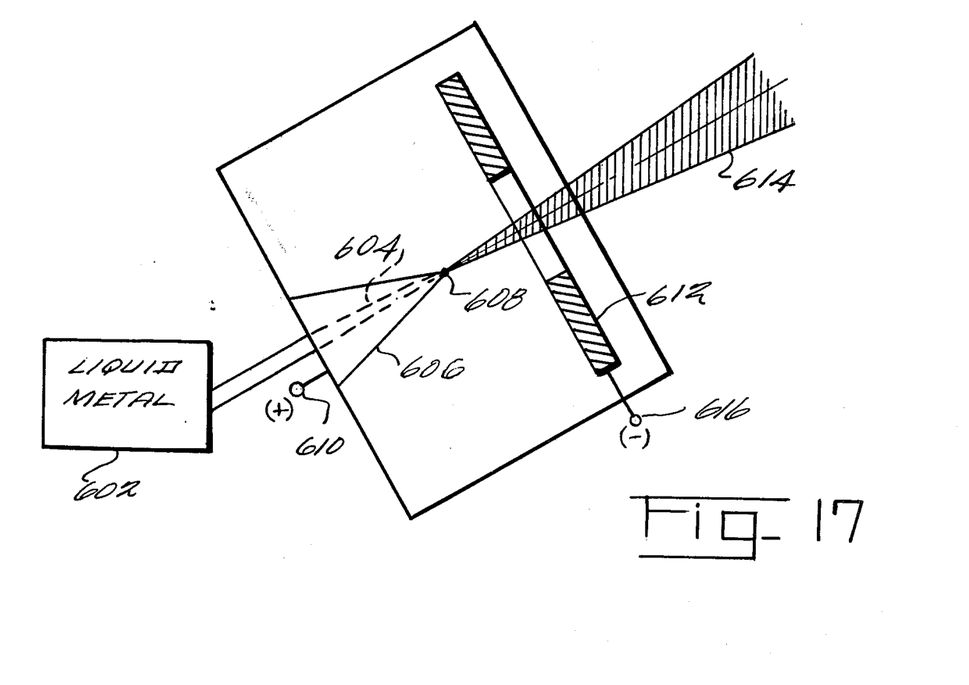
FIG. 17 is a schematic diagram of an alternative ion source using a field effect/gas source.

The ion sources usually employed can be grouped together in three main categories:

ion sources of the duoplasmatron type: the ion source is a plasma created by a discharge and confined by a high magnetic field. By way of example, a source of this type is described in U.S. Pat. No. 3,699,334 (to Cohen et al.);

field-effect sources and liquid-metal sources: a pointed anode having an axis of revolution is provided with a capillary tube which is coaxial with the axis of revolution and has its opening at the end of the anode. Said anode is positively biased with respect to an accelerating cathode. A liquid metal such as gallium, for example, is introduced into the capillary tube. The liquid metal discharged from the capillary tube under the action of electrostatic forces assumes a shape in which it is tapered very progressively to a thin, sharp point at the end of which is produced a sufficiently powerful field to ionize and accelerate the atoms of the liquid metal;

Referring to FIG. 17 there is shown a schematic diagram of a field effect source using a liquid metal. A liquid metal source 602 is coupled to a capillary tube 604 running along the axis of revolution of a pointed anode 606 having an opening at the point 608 thereof. Anode 606 is positively biased by an electrode 610. The liquid metal from source 602 is introduced through the capillary tube and discharged from tip 608 under the electrostatic forces developed by the potential difference between anode 606 and an accelerating cathode 612 biased at an electrode 616 to produce a primary ion beam 614;

and the field-effect ion sources for the ions of a gas: a positively biased point in a gas atmosphere at low pressure (of the order of $7 \times 10^{-5}$ Pa) produces in the vicinity of the point an electric field of sufficiently high strength to ionize and accelerate the gas atoms which are present in the immediate vicinity of said point.

Figure 18:
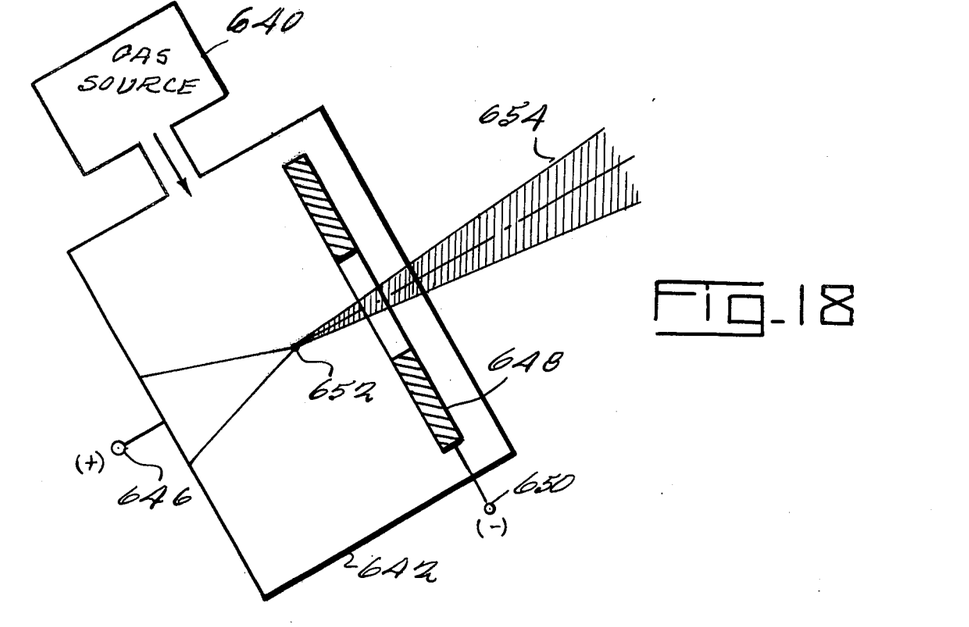
FIG. 18 is a schematic diagram of an alternative ion source using a field effect/liquid metal source.

Referring to FIG. 18 there is shown a schematic diagram of a field effect ion source for the ions of a gas. A gas source 640 injects a gas into an enclosure 642 containing an anode 644. Anode 644 is biased by a positive electrode 646 to set up an electrostatic potential between anode 644 and an accelerating cathode 648 which is negatively biased by a negative electrode 650. The positively biased point 652 of anode 644 in the gas atmosphere of low pressure produces in the vicinity of the point an electric field of sufficiently high strength to accelerate gas atoms to produce a primary ion beam 654.

A source which combines the two effects just mentioned is described, for example, in U.S. Pat. No. 4,085,330 (to Wolfe).

The sources of the first type have fairly low brightness and this results in low intensity of the sample bombardment current. The sources of the second and third types have a much higher degree of brightness. However, when a very narrow beam is desired (and this is usually the case when it is desired to construct semiconductor circuits having very high integration density), the exposure times must increase to an appreciable extent and the etching process is thus considerably slowed-down.

The second approach for the practical application of arrangements which are similar to those adopted in the case of devices for microlithography by electron bombardment in accordance with the first approach makes it possible to increase the speed of the etching process while employing ion sources having low brightness.

Figure 15:
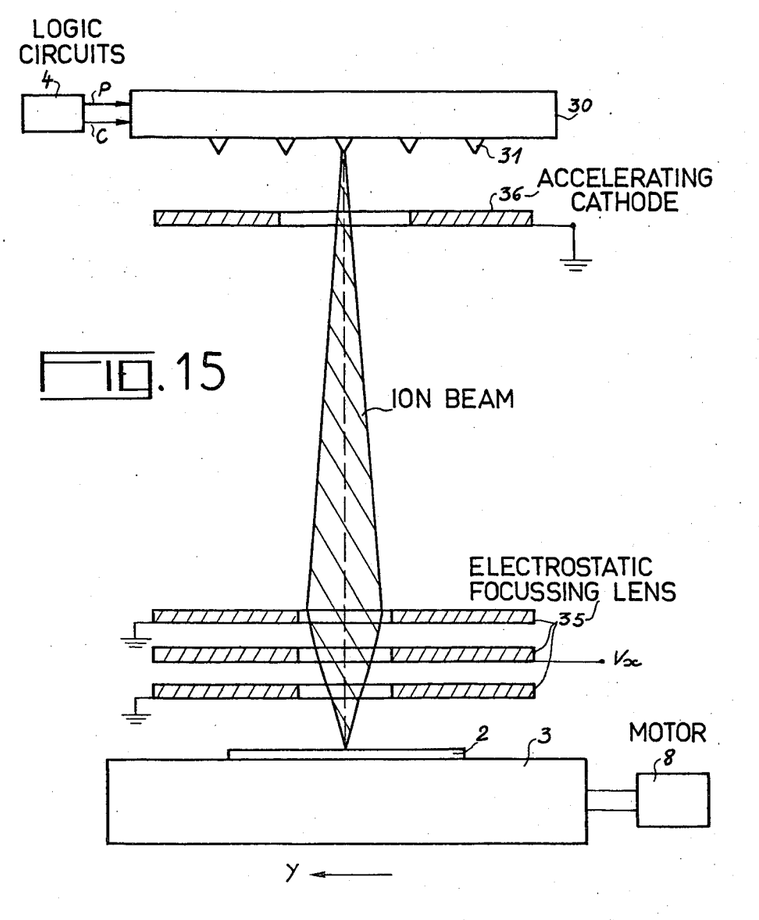
FIG. 15 is a schematic diagram of a first alternative embodiment of the invention in accordance with the second approach consisting of bombardment with an ion beam.
Figure 16:
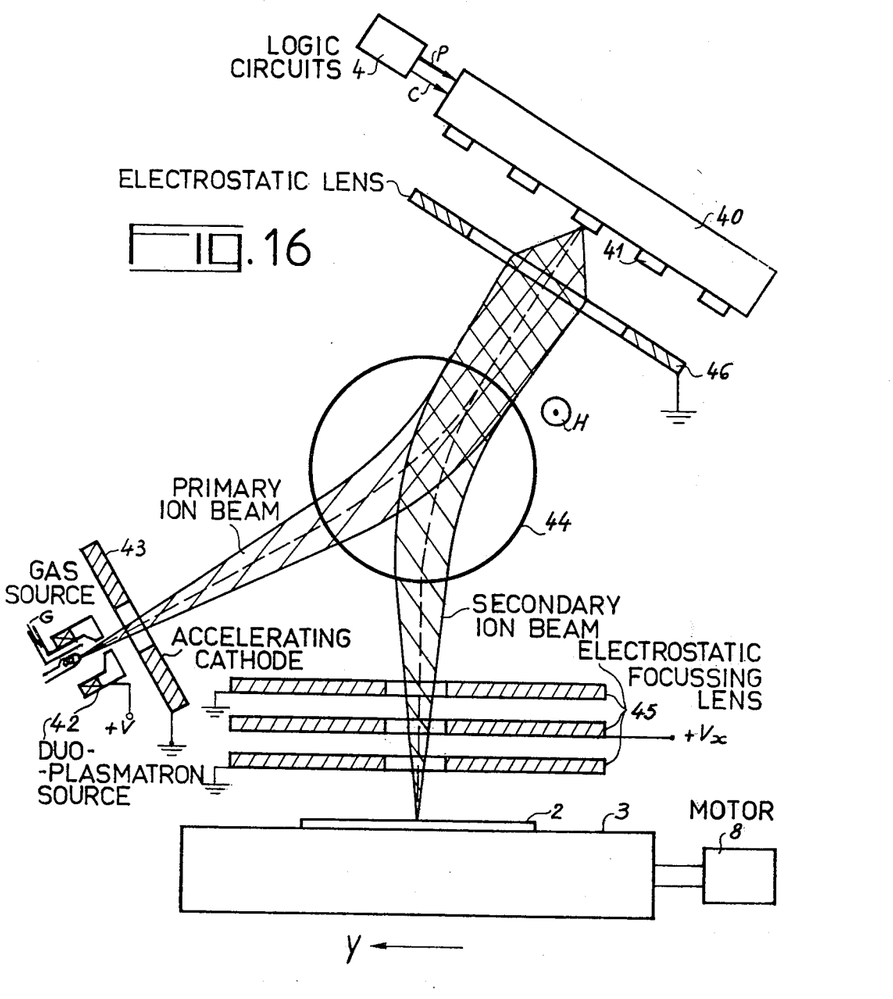
FIG. 16 is a schematic diagram of a second alternative embodiment in accordance with said second approach.

FIG. 15 shows a device for microlithography by bombardment with an ion beam in accordance with a first alternative embodiment of the second approach.

In this alternative embodiment, the ion source is preferably of the third type described earlier, namely a field-effect source for ions of a gas. In fact, a source of the duoplasmatron type has an emission cross-section which is much too high (500 μm to 1 mm). This would entail the need to employ an imaging system having a magnification of the order of 1/1000 in order to obtain a desirable degree of fineness of etching, thereby giving rise to a large number of difficulties.

The source described in the foregoing utilizes a structure which is similar to that described earlier with reference to FIGS. 2 and 3. It is only necessary to reverse the polarities of the electric potentials to be applied.

The cones can have a base of tungsten, of iridium or of refractory material. The assembly must be placed in an atmosphere of a gas from which it is desired to produce the ions, at a pressure of approximately $7 \times 10^{-5}$ Pa. In order to activate a cone (logical state "1") it is only necessary to bring it to a voltage of approximately +20 V with respect to the layer 105. The cone then produces ions in the vicinity of the point. The gas can be hydrogen, for example.

Referring again to FIG. 15, the operation of the device will now be explained in detail. The operation is similar to that described with reference to FIG. 1. Only the principal steps will be recalled. A source of numerical data (not shown) delivers binary data to interface logic circuits 4 in accordance with a pre-established program with a view to etching a predetermined pattern on a sample 2, said sample being rigidly fixed to an object-holder 3 which is set in motion and displaced along the axis Y by means of a motor 8. In a first step, it is assumed that this displacement takes place in step-by-step motion. The logic circuits 4 also receive on the input Y information on the position of the object-holder by means of a suitable position sensor not shown in the figure. By means of these data, a clock signal C is generated and serves to initiate loading of binary data P into the shift registers $R_l$ to $R_m$ which are similar to those illustrated in FIG. 2. Each register comprises n stages which can assume two logical states "0" or "1". The potential V or V+ΔV corresponding to the state of each stage $A_j$ is applied to one element 31 of the array of ion sources 30. Each ion source designated in FIG. 2 by the reference $S_j$ is of very small size and is made active when the stage $A_j$ of the corresponding shift register is in state "1" and is passive when this is not the case. An imaging system 36 and 35 forms a real image of said source 30 on the object-holder 3 with a magnification of the order of $-(1/100)$. The potential V is of the order of +60 kV. The electrode 36 is an accelerating cathode connected to the potential 0 V. The set of lenses 35 which are alternately at the potential 0 V and at the voltage Vs forms the imaging system. The voltage Vx varies in the vicinity of 60 kV in order to focus the ion beam produced by the active elements of the source 30. The information is then shifted within the shift registers to the following stages by means of the clock pulses C. The mean shift rate is proportional to the rate of displacement of the object-holder in a ratio equal to the magnification. The driving motor 8 is preferably not a stepping motor which gives rise to practical difficulties but a motor which ensures a uniform displacement. A displacement of the ion beam must therefore take place correlatively in order to ensure that the impact of this beam on the sample remains fixed. To this end, use can be made of the means described with reference to FIGS. 13 and 14.

Although a process of rapid writing on the sample is ensured, this type of source may prove difficult to carry into practical effect. A second alternative embodiment of the ion bombardment microlithographic device which will be described with reference to FIG. 16 makes it possible to overcome these difficulties. This alternative embodiment is similar to the second alternative embodiment in accordance with the first approach of the invention as illustrated in FIG. 4.

Accordingly, preference is given to the use of an ion source of the duoplasmatron type described earlier and designated by the reference 42. This source receives a suitable gas G such as Xenon, for example, and is brought to a potential +V of the order of 60 kV. Said source no longer serves directly to bombard the sample 2 since this would call for an imaging system having a magnification which is too low as recalled earlier but serves to project ions onto an array 40 of reflecting pads 41 through a magnetic deflecting prism 44. The magnetic field H is perpendicular to the plane of the figure.

The array 40 has a structure which is similar to that shown in FIG. 6. Said array is constituted by pads 41 of conductive material and disposed in a matrix as in the previous case. Each pad is connected to a bistable multivibrator or flip-flop (not shown in the figure) which is integrated in a substrate of doped silicon deposited on intrinsic silicon in a similar manner to that shown in FIG. 6. Said pads are at the potential +V when the corresponding stage is in state "0" and are at the potential $+(V+\Delta V)$ when said stage is in state "1", where $\Delta V$ is of the order of 20 V and V is of the order of 60 kV as in the previous case.

An electrostatic lens 46 is placed in the vicinity of said array and brought to the potential 0 V. An electrostatic accelerating cathode 43 which is brought to the potential 0 V accelerates the ions through the magnetic prism 44.

Only those ions which are directed towards the pads at the potential $+(V+\Delta V)$ are reflected. The general principle of operation in this case is exactly the same as if the last pads were anodes of the same type as the first alternative embodiment and "emitted" ions with an accelerating voltage $\Delta V$ of the order of 20 volts as in the previous case. These ions pass again through the prism 44. They are directed towards an array of electrostatic lenses 45. In conjunction with the array 46-40, the lenses just mentioned form an imaging system in conjunction with the assembly 46-40. With respect to said imaging system, that face of the array of pads 40 which is subjected to the impact of electrons and the plane 2 of the sample to be bombarded are stigmatic. Said assembly has a magnification of $-(1/100)$. As in the previous instance, a continuous movement is imparted to the object-holder 3 along the axis Y. The operation of the device of FIG. 16 is similar to the operation of the device described in relation to FIG. 4. The binary data P are introduced into the shift registers $R_l$ to $R_m$ (not shown), the stages of which are associated with the pads 41 via the logic circuits 4 and shifted by means of clock pulses C.

The type of source which is preferably employed in this alternative form of construction (duoplasmatron) is both simple and stable while having a homogeneous emission diagram which results in uniform illumination. The low brightness of this type of source is compensated by the fact that a large number of points are processed at the same time, namely all the active pads contained in the matrix. However, the other two types of sources described earlier can also be employed, especially the field-effect source and liquid-metal source when it is desired to sputter material which is present on the sample by direct ion bombardment. Finally, in the two alternative embodiments which have just been described, pumping means (not shown) maintain a low pressure and have the effect of removing static atoms.

By way of illustration, typical values which characterize microlithographies by bombardment with an electron beam or with an ion beam are summarized hereinafter in Table 1.

It is apparent from Table 1 that, in regard to exposure on resin, a field-effect ion source permits exposure times which are comparable with an electron source. In regard to direct ion sputtering, however, the only types of source which are suitable for use by virtue of their intrinsic nature are the field-effect ion sources.

The present invention is not limited solely to the examples of construction which have been described in the foregoing in order to illustrate the alternative embodiments of the two approaches of the invention. As mentioned earlier, it is possible to employ types of sources other than those shown in FIGS. 15 and 16.

Moreover, the writing of a pattern of large size may entail the need for page by page exposure. It is possible in this case to employ a number of matrices of elements or even in the same matrix loaded with a number of successive programs.

TABLE 1

| | |
|---|---|
| Energy of ions | 50 keV |
| Energy of electrons | 20 keV |
| Brightness of an ion source | |
| of the duoplasmatron type (at 60 kV) | 90 A cm$^{-2}$ sr$^{-1}$ |
| of the field-effect type (the metal being gallium) | $5 \times 10^5$ A cm$^{-2}$ sr$^1$ |
| Brightness of an electron source (with heated tungsten cathode) | $5 \times 10^4$ A cm$^{-2}$ sr$^{-1}$ |
| Density of current in an ion image with a field-effect source | 1 A cm$^{-2}$ |
| Time of exposure of an image on a resin: | |
| Ion sources of the duoplasmatron type | $3 \times 10^{-3}$ s |
| Ion sources of the field-effect type | $10^{-6}$ s |
| Electron source | $10^{-6}$ s |
| by sputtering of 1 µm of gold | |
| Ion source of the duoplasmatron type | 300 s |
| Field-effect ion source | $10^{-1}$ s |

What is claimed is:

1. A microlithography device for drawing a predetermined pattern on a sample comprising:
   a movable object holder for carrying said sample;
   means for moving said object holder;

a data source containing readable data specifying said pattern;

means for providing charged particles including an array of elements arranged in a first plane, the elements positioned so as to correspond to a matrix, each element emitting a beam of charged particles when modulated to a first "on" state and not emitting a beam of charged particles when modulated to a second "off" state;

position sensor means for sensing the displacement of said object holder and hence the displacement of said sample carried on said object holder;

an imaging system for focusing the charged particle beams from said array of source elements into the plane of said sample; and means, coupled to said data source and to said position sensor means, for sequentially applying signals to said array of elements so as to modulate them in accordance with said pattern and in synchronism with the displacement of said object holder said means for providing charged particles comprising a single source of charged particles, focusing means for producing a focused beam of said particles and a magnetic prism for deflecting said focused beam toward said array of elements through an electrostatic lens, each element being operable in an active state in which charged particles issuing from said single source are reflected toward said sample through a further passage through said lens and prism, and operable in a passive state in which no such reflection occurs.

2. A device according to claim 1 wherein said elements comprise conductive pads, said array of elements being integrated on a semi-conductor substrate in which said means for sequentially applying signals are also integrated, each pad being electrically insulated with respect to the other such pads.

3. A device according to claim 1 wherein said charged particles are ions and said single source of particles is an ion source of the duoplasmatron type.

4. A device according to claim 1 wherein said charged particles are ions and said single source of charged particles is an ion source of the field effect type comprising a gas under low pressure, said gas being brought into the proximity of an anode of elongated shape terminating in a point.

5. A device according to claim 1 wherein said charged particles are ions and said single source is a source of ions of the field effect type comprising an anode of elongated shape terminating in a point and a capillary tube in which a liquid metal is circulated.

6. A device according to claim 1 wherein said charged particles are electrons.

7. A device according to claim 1 wherein said charged particles are ions.

8. A microlithography device for drawing pre-established patterns on a sample comprising:

a movable object holder for carrying said sample;
means for moving said object holder;
a data source containing readable data specifying a pattern to be drawn on said sample;
a charged particle source for generating a primary beam of charged particles;
an accelerating electrode for accelerating the charged particles of said primary beam;

a magnetic deflecting prism for guiding said primary beam;

a first focusing means for focusing said primary beam having passed through said magnetic deflecting prism;

an array of elements arranged in a first plane, the elements positioned so as to correspond to a matrix, each element reflecting the charged particles impinging thereon when modulated to a first "on" state and absorbing charged particles impinging thereon when modulated to an "off" state, reflected particles forming a secondary beam making a second pass through said first focusing means and through said magnetic deflecting prism;

a second focusing means for focusing said secondary beam onto said sample;

position sensor means for sensing the displacement of said object holder and hence the displacement of said sample carried on said object holder; and means, coupled to said data source and to said position sensor means and receiving information therefrom for sequentially applying signals to said elements so as to modulate them to on or off states in accordance with the pattern to be drawn in synchronism with the displacement of said object holder.

9. A device according to claim 8 wherein said charged particles are electrons.

10. A device according to claim 8 wherein said charged particles are ions.

11. A device according to claim 8 wherein said elements comprise conductive pads, said matrix of elements being integrated onto a semi-conductor substrate in which said means for sequentially applying signals are also integrated and each pad is electrically insulated from other such pads.

12. A device according to claim 8 wherein said charged particle source is an ion source of the field effect type comprising a gas under low pressure, and an anode of elongated shape terminating in a point, said gas being brought into the proximity of said anode.

13. A device according to claim 8 wherein said charged particle source is an ion source of the field effect type comprising an anode of elongated shape terminating in a point and a capillary tube in which a liquid metal is circulated.

14. A device according to claim 8 wherein said means for sequentially applying signals comprises a plurality of flip-flops disposed along the lines and columns of a matrix, each flip-flop associated with an element and wherein the flip-flops of a single column receive binary data simultaneously and the flip-flops of a single line are interconnected so as to form the stages of a shift register which receives clock pulses for controlling the shift thereof, the frequency of said clock pulses being such that the mean rate of transmission of binary data from one stage to the next in each shift register is proportional to the rate of displacement of the object holder.

15. A device according to claim 8 further comprising means for electronically deflecting said charge particle beam in order to nullify the effects of relative motion of the beam with respect to said object holder, said means being controllable by an electrical signal having a sawtooth waveform.

* * * * *